United States Patent
Li et al.

(10) Patent No.: US 6,876,235 B2
(45) Date of Patent: Apr. 5, 2005

(54) SOURCE FOLLOWER CAPABLE OF COMPENSATING THE THRESHOLD VOLTAGE

(75) Inventors: Ying-Hsin Li, Kaohsiung (TW); An Shih, Changhua (TW)

(73) Assignee: Toppoly Optoelectronics Corp., Miao-Li County ( * ) Notice: Subject to any disclaimer, the term of this patent is extended or adjusted under 35 U.S.C. 154(b) by 0 days.

(21) Appl. No.: 10/249,866

(22) Filed: May 14, 2003

(65) Prior Publication Data

US 2004/0178831 A1 Sep. 16, 2004

(51) Int. Cl.[7] .................................................. H03B 1/00
(52) U.S. Cl. ........................................................ 327/112
(58) Field of Search ................................ 327/108, 112, 327/391, 427, 437, 137, 538, 543, 434; 326/83, 85, 87

(56) References Cited

U.S. PATENT DOCUMENTS

| | | | | |
|---|---|---|---|---|
| 5,280,511 A | * | 1/1994 | Fujii et al. ..................... 377/60 |
| 5,701,136 A | * | 12/1997 | Huq et al. .................. 345/100 |
| 5,872,473 A | * | 2/1999 | Williams ..................... 327/108 |
| 6,181,314 B1 | * | 1/2001 | Nakajima et al. ........... 345/100 |
| 6,243,066 B1 | * | 6/2001 | Murakami et al. ............. 345/98 |

* cited by examiner

*Primary Examiner*—My-Trang Nu Ton
(74) *Attorney, Agent, or Firm*—Jianq Chyun IP Office

(57) ABSTRACT

A source follower capable of compensating the threshold voltage is provided. The source follower comprises a current source, a switching circuit, and a thin film transistor. The source follower makes the threshold voltage of the thin film transistor constant by using the current source, and makes the input voltage nearly equal to the output voltage by using the storage capacitor and the compensating capacitor. Thus, it can make the error of the output voltage fall in the error range of the gray level voltage.

8 Claims, 3 Drawing Sheets

SOURCE FOLLOWER CAPABLE OF COMPENSATING THE THRESHOLD VOLTAGE

BACKGROUND OF INVENTION

1. Field of the Invention

The present invention relates to a source follower, and more particularly, to a source follower capable of compensating the threshold voltage.

2. Description of the Related Art

After the liquid crystal material is first discovered by the European, the American dedicated in researching and developing its applications, the Japanese further deeply studies its physical characteristics and the applied technologies in various fields, so that new generation LCD (Liquid Crystal Display) has been continuously developed. Currently, various liquid crystal techniques had been widely applied in the display. Especially for the LCD, the TN-LCD (Twisted Nematic-Liquid Crystal Display) is expanded to the STN-LCD (Super Twisted Nematic-Liquid Crystal Display), and further expanded to the TFT-LCD (Thin Film Transistor LCD) by the makers, and its scale is getting bigger now. Further, some LCD makers start to develop the manufacturing techniques of the LTPS-LCD (Low Temperature Poly-Si Liquid Crystal Display) now.

Currently, the technique of the LTPS TFT (Low Temperature Poly-Si Thin Film Transistor) had been applied in the LCD panel, besides using as the active element of the LCD, it is also used to integrate the high integrated circuit into the circuit of the glass substrate. Wherein, the data line driving circuit is the portion that is rather hard to deal with, since the threshold voltage of the LTPS TFT is rather higher, if the amplifier circuit is used, the analog output voltage is impacted by the threshold voltage and thus results in the signal distortion.

Referring to both FIG. 1A and FIG. 1B, it schematically shows a circuit diagram and a timing diagram of a push-pull analog buffer capable of compensating the threshold voltage, respectively. The push-pull analog buffer 100 comprises an n-type transistor 110, a p-type transistor 120, a 1st switch 132, a 2nd switch 142, and a 3rd switch 152.

The drain 112 of the n-type transistor 110 is coupled to a positive voltage, and the source 114 of the n-type transistor 110 outputs an output voltage. The source 124 of the p-type transistor 120 is coupled to the source 114 of the n-type transistor 110, the drain 122 of the p-type transistor 120 is grounded, and the gate 126 of the p-type transistor 120 is coupled to the gate 116 of the n-type transistor 110. The 1st switch 132 comprises a 1st electrode 134 and a 2nd electrode 136. Wherein, the 1st electrode 134 is coupled to an input voltage, the 2nd electrode 136 is coupled to the gate 116 of the n-type transistor 110. The 2nd switch 142 comprises a 3rd electrode 144 and a 4th electrode 146. Wherein, the 3rd electrode 144 is coupled to an input voltage. The 3rd switch 152 comprises a 5th electrode 154 and a 6th electrode 156. Wherein, the 5th electrode 154 is coupled to the 4th electrode 146, and the 6th electrode 156 is coupled to the source 114 of the n-type transistor 110. The storage capacitor 162 comprises a 7th electrode 164 and an 8th electrode 166. Wherein, the 7th electrode 164 is coupled to the 2nd electrode 136, and the 8th electrode 166 is coupled to the 4th electrode 146.

The operating process of the push-pull analog buffer 100 is described hereinafter. At first, the 1st switch 132 and the 3rd switch 152 are shorted, and the 2nd switch 142 is opened. Meanwhile, the potential stored in the storage capacitor 162 is equal to the threshold voltage of the n-type transistor 110. Then, the 1st switch 132 and the 3rd switch 152 are opened, and the 2nd switch 142 is shorted. Meanwhile, the voltage at the gate 116 of the n-type transistor 110 is a summation of the input voltage and the threshold voltage, so that the output voltage is nearly equal to the input voltage. Wherein, the input, voltage is greater than the threshold voltage of the n-type transistor 110.

However, in the push-pull analog buffer 100, when the input voltage is smaller than the threshold voltage of the n-type transistor 110 and the p-type transistor 120, since the n-type transistor 110 and the p-type transistor 120 are working in the cut-off section, the push-pull analog buffer 100 cannot work normally. Further, when the input voltage is increased to reach the threshold voltage, the operating point of the push-pull analog buffer 100 is shifted, and there is some minor error existed in the output voltage and the input voltage. Therefore, the error value is very possible over the gray-level error tolerance when it is operated in high-level analysis.

In summary, the conventional source follower has following disadvantages: (1) In the push-pull analog buffer 100, the circuit cannot work normally when the input voltage is smaller than the threshold voltage of the transistor. (2) In the push-pull analog buffer 100, the error value is very possible over the gray-level error tolerance when it is operated in high-level analysis.

SUMMARY OF INVENTION

To solve the problem mentioned above, the present invention provides a source follower that is suitable for using in the display and is capable of compensating the threshold voltage. The source follower makes the circuit of the capacitor switch manufacture before the source follower circuit, and makes the threshold voltage of the TFT constant by using the current source, so that the output voltage can nearly equal to the input voltage.

The present invention provides a source follower capable of compensating the threshold voltage. The source follower comprises an n-type transistor, a current source, and a switching circuit. The n-type transistor mentioned above comprises a drain, a gate, and a source, wherein the drain is coupled to a positive voltage, and the source outputs an output voltage. The current source mentioned above comprises a 1st electrode and a 2nd electrode, wherein the 1st electrode is coupled to the source of the n-type transistor, and the 2nd electrode is grounded. The switching circuit mentioned above is coupled to the n-type transistor, the current source, and the input voltage. Wherein, the switching circuit comprises a 1st switch, a 2nd switch, a 3rd switch, and a storage capacitor.

As described in the preferred embodiment according to the present invention, the 1st switch comprises a 3rd electrode and a 4th electrode. Wherein, the 3rd electrode is coupled to the input voltage, and the 4th electrode is coupled to the gate of the n-type transistor. As described in the preferred embodiment according to the present invention, the 2nd switch mentioned above comprises a 5th electrode and a 6th electrode. Wherein, the 5th electrode is coupled to the input voltage and the 3rd electrode.

As described in the preferred embodiment according to the present invention, the 3rd switch mentioned above comprises a 7th electrode and an 8th electrode. Wherein, the 7th electrode is coupled to the 6th electrode, and the 8th electrode is coupled to the source of the n-type transistor and the 1st electrode.

As described in the preferred embodiment according to the present invention, the storage capacitor mentioned above comprises a 9th electrode and a tenth electrode. Wherein, the 9th electrode is coupled to the 4th electrode and the gate of the n-type transistor, and the tenth electrode is coupled to the 6th electrode and the 7th electrode.

As described in the preferred embodiment according to the present invention, when the 1st switch and the 3rd switch are short, and the 2nd switch is open, the potential stored in the storage capacitor is equal to the threshold voltage of the n-type transistor. Meanwhile, the voltage at the gate of the n-type transistor is a summation of the input voltage and the threshold voltage.

The present invention further provides the other source follower capable of compensating the threshold voltage. The source follower comprises a p-type transistor, a current source, and a switching circuit. The p-type transistor mentioned above comprises a drain, a gate, and a source, wherein the drain is grounded, and the source outputs an output voltage. The current source mentioned above comprises a 1st electrode and a 2nd electrode, wherein the 1st electrode is coupled to a positive voltage, and the 2nd electrode is coupled to the source of the p-type transistor. The switching circuit mentioned above is coupled to the p-type transistor, the current source, and the input voltage. Wherein, the switching circuit comprises a 1st switch, a 2nd switch, a 3rd switch, and a storage capacitor.

As described in the preferred embodiment according to the present invention, the 1st switch comprises a 3rd electrode and a 4th electrode. Wherein, the 3rd electrode is coupled to the input voltage, and the 4th electrode is coupled to the gate of the p-type transistor.

As described in the preferred embodiment according to the present invention, the 2nd switch mentioned above comprises a 5th electrode and a 6th electrode. Wherein, the 5th electrode is coupled to the input voltage and the 3rd electrode.

As described in the preferred embodiment according to the present invention, the 3rd switch mentioned above comprises a 7th electrode and an 8th electrode. Wherein, the 7th electrode is coupled to the 6th electrode, and the 8th electrode is coupled to the source of the p-type transistor and the 2nd electrode.

As described in the preferred embodiment according to the present invention, the storage capacitor mentioned above comprises a 9th electrode and a tenth electrode. Wherein, the 9th electrode is coupled to the 4th electrode and the gate of the p-type transistor, and the tenth electrode is coupled to the 6th electrode and the 7th electrode.

As described in the preferred embodiment according to the present invention, when the 1st switch and the 3rd switch are short, and the 2nd switch is open, the potential stored in the storage capacitor is equal to the threshold voltage of the p-type transistor. Meanwhile, the voltage at the gate of the p-type transistor is equal to the voltage of subtracting the threshold voltage from the input voltage.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

The present invention makes the capacitor switch manufacture before the source follower of the n-type transistor (e.g. n-type LTPS TFT) or the source follower of the p-type transistor (e.g. p-type LTPS TFT), and makes the threshold voltage of the transistor constant by using the current source. Therefore, the source follower of the present invention is not operated in the dead section. Further, the source follower of the present invention is suitable for using in the display (e.g. LCD).

Figure 1A:
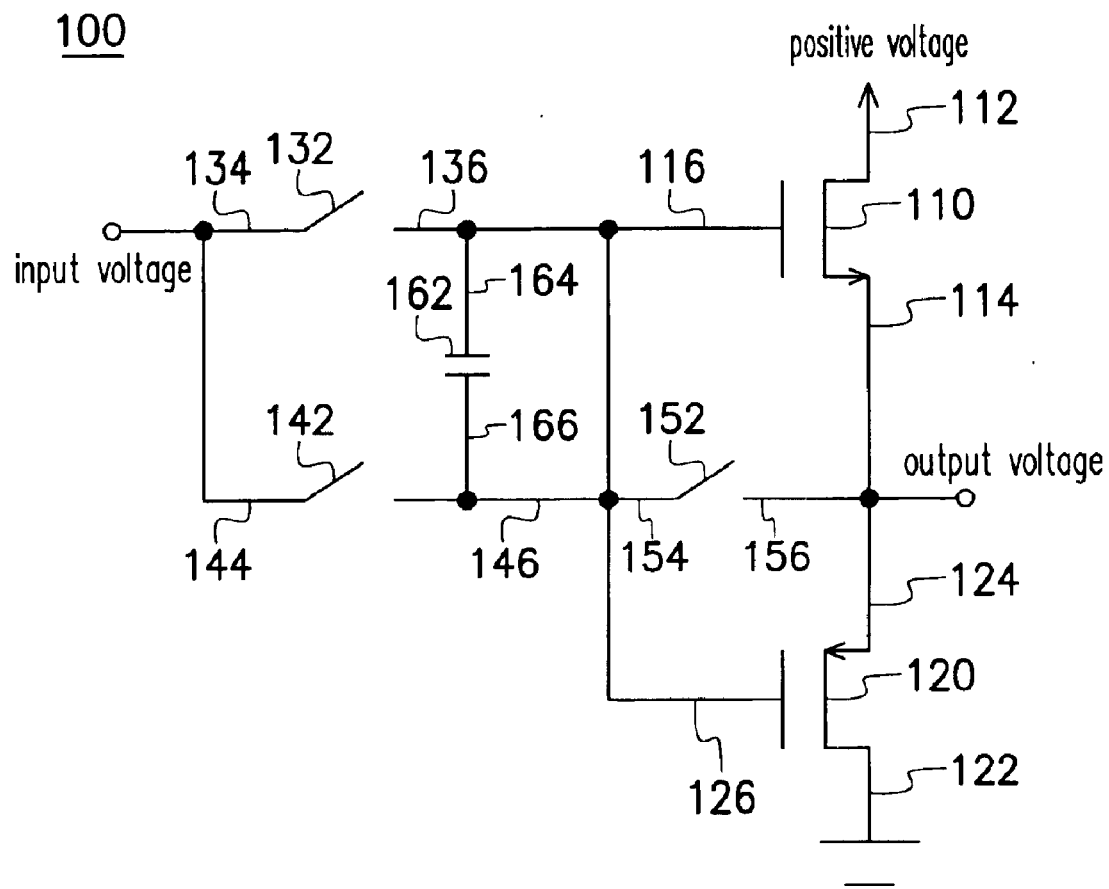
FIG. 1A schematically shows a circuit diagram of a push-pull analog buffer capable of compensating the threshold voltage.
Figure 1B:
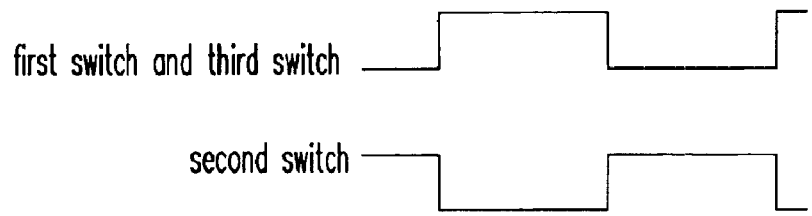
FIG. 1B schematically shows a timing diagram of a push-pull analog buffer capable of compensating the threshold voltage.
Figure 2A:
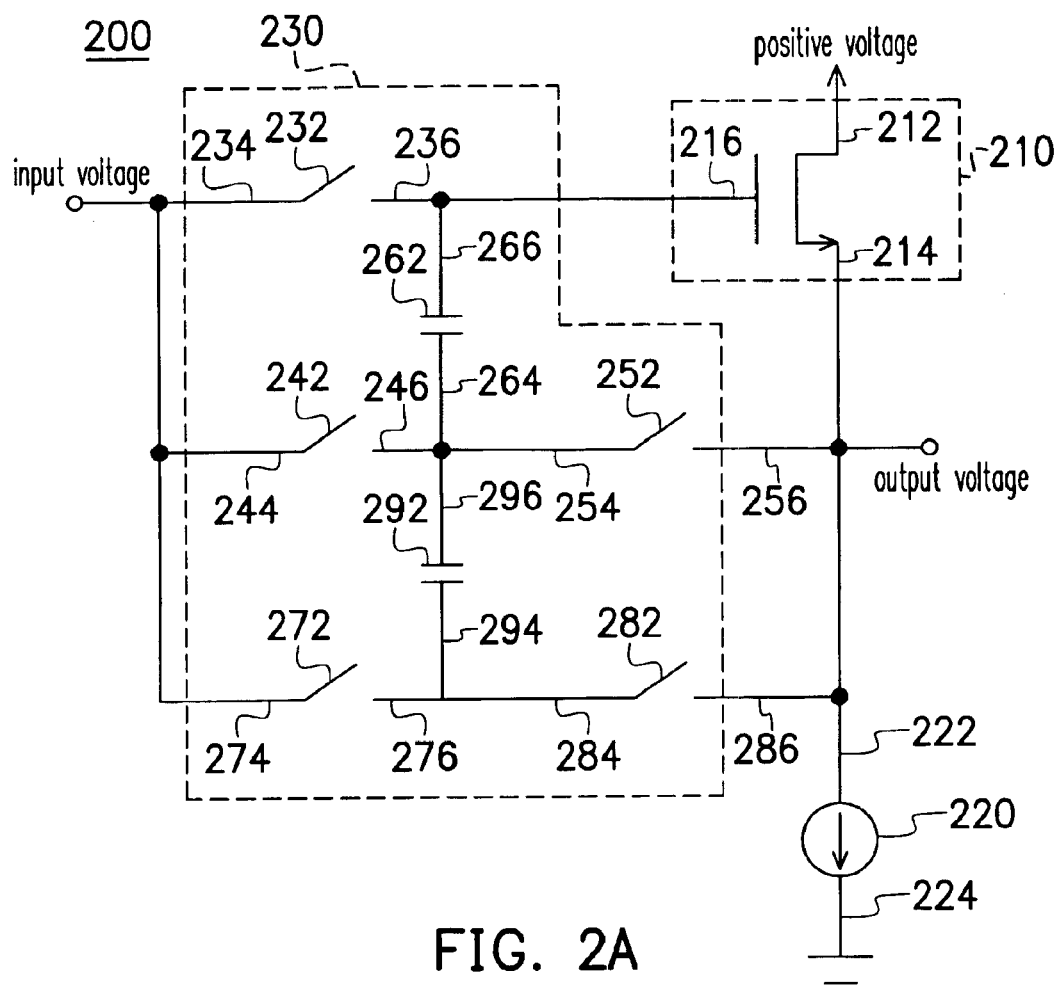
FIG. 2A schematically shows a circuit diagram of a source follower capable of compensating the threshold voltage of a preferred embodiment according to the present invention.
Figure 2B:
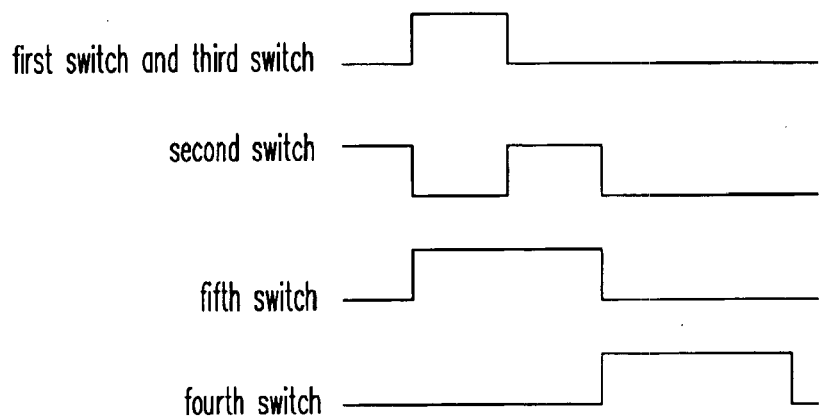
FIG. 2B schematically shows a timing diagram of a source follower capable of compensating the threshold voltage of the preferred embodiment according to the present invention.

Then, a switching circuit comprising at least one capacitor and a plurality of switches is exemplified hereinafter to describe the source follower of the present invention. At first, a source follower of the n-type transistor is described. Referring to both FIG. 2A and FIG. 2B, it schematically shows a circuit diagram and a timing diagram of a source follower capable of compensating the threshold voltage of the preferred embodiment according to the present invention, respectively. As shown in FIG. 2A, the source follower 200 comprises an n-type transistor 210, a current source 220, and a switching circuit 230. The n-type transistor 210 comprises a drain 212, a gate 216 and a source 214, wherein the drain 212 is coupled to a positive voltage, and the source 214 outputs an output voltage. The current source 220 comprises a 1st electrode 222 and a 2nd electrode 224, wherein the 1st electrode 222 is coupled to the source 214 of the n-type transistor 210, and the 2nd electrode 224 is grounded. The switching circuit 230 is coupled to the n-type transistor 210, the current source 220, and the input voltage.

At first, only the switching circuit 230 comprising a 1st switch 232, a 2nd switch 242, a 3rd switch 252, and a storage capacitor 262 is exemplified herein for description. In the switching circuit 230, the 1st switch 232 comprises a 3rd electrode 234 and a 4th electrode 236. Wherein, the 3rd electrode 234 is coupled to the input voltage, and the 4th electrode 236 is coupled to the gate 216 of the n-type transistor 210. The 2nd switch 242 comprises a 5th electrode 244 and a 6th electrode 246. Wherein, the 5th electrode 244 is coupled to the input voltage and the 3rd electrode 234. The 3rd switch 252 comprises a 7th electrode 254 and an 8th electrode 256. Wherein, the 7th electrode 254 is coupled to the 6th electrode 246, and the 8th electrode 256 is coupled to the source 214 of the n-type transistor 210 and the 1st electrode 222. The storage capacitor 262 comprises a 9th electrode 266 and a tenth electrode 264. Wherein, the 9th electrode 266 is coupled to the 4th electrode 236 and the gate 216, and the tenth electrode 264 is coupled to the 6th electrode 246 and the 7th electrode 254. Then, the operating process of the source follower 200 that only includes a capacitor is described hereinafter. At first, the 1st switch 232 and the 3rd switch 252 are shorted, and the 2nd switch 242 is opened. Meanwhile, the storage capacitor 262 stores a potential that is equal to the threshold voltage of the n-type transistor 210. Then, the 1st switch 232 and the 3rd switch 252 are opened, and the 2nd switch 242 is shorted. Meanwhile, the voltage at the gate 216 of the n-type transistor 210 is a summation of the input voltage and the threshold voltage of the n-type transistor 210. Therefore, the output voltage is nearly equal to the input voltage.

Then, the switching circuit 230 comprising a 4th switch 272, a 5th switch 282, and a compensating capacitor 292 is exemplified hereinafter for description. For those who are skilled in the art, it is to be noted that although the switching circuit 230 comprising only two capacitors and a plurality of switches is exemplified hereinafter for description, the switching circuit comprising more than two capacitors and a plurality of switches also can be applied in the present invention. In the switching circuit 230, the 4th switch 272 comprises an 11th electrode 274 and a 12th electrode 276. Wherein, the 11th electrode 274 is coupled to the 3rd electrode 234, the 5th electrode 244, and the input voltage. The 5th switch 282 comprises a 13th electrode 284 and a 14th electrode 286. Wherein, the 13th electrode 284 is coupled to the 12th electrode 276, and the 14th electrode 286 is coupled to the 1st electrode 222, the 8th electrode 256, and the source 214 of the n-type transistor 210. The compensating capacitor 292 comprises a 15th electrode 294 and a 16th electrode 296. Wherein, the 15th electrode 294 is coupled to the 12th electrode 276 and the 13th electrode 284, and the 16th electrode 296 is coupled to the 6th electrode 246, the 7th electrode 254, and the 10th electrode 264. The operating process of the source follower 200 comprising two capacitors is described hereinafter. At first, the 1st switch 232, the 3rd switch 252, and the 5th switch 282 are shorted, and the 2nd switch 242 and the 4th switch 272 are opened. Meanwhile, the storage capacitor 262 stores a potential that is equal to the threshold voltage of the n-type transistor 210, and the compensating capacitor 292 is reset. Then, the 1st switch 232, the 3rd switch 252, and the 4th switch 272 are opened, and the 2nd switch 242 and the 5th switch 282 are shorted. Meanwhile, the voltage at the gate 216 of the n-type transistor 210 is a summation of the input voltage and the threshold voltage stored in the storage capacitor 262. Therefore, an error voltage that differs from the output voltage is formed, and the error voltage is stored in the compensating capacitor 292. Finally, the 1st switch 232, the 2nd switch 242, the 3rd switch 252, and the 5th switch 282 are opened, and the 4th switch 272 is shorted. Meanwhile, the voltage at the gate 216 of the n-type transistor 210 is a summation of the input voltage plus the threshold voltage and plus the error voltage, so that the difference between the input voltage and the output voltage is shorten to within the gray level error tolerance. From above descriptions, the more the capacitors and switches comprised in the switching circuit 230, the smaller the error between the input voltage and the output voltage.

Figures 3A, 3B:
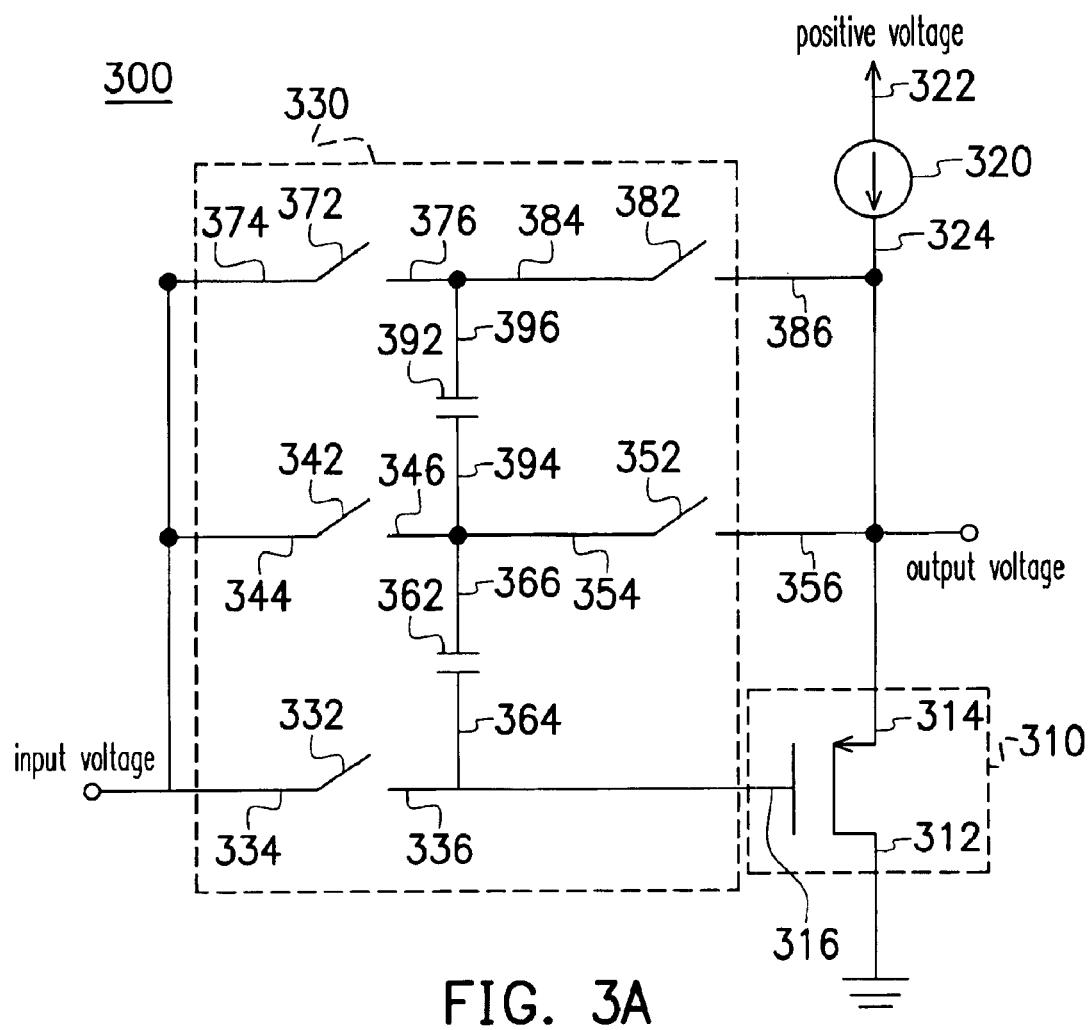
FIG. 3A schematically shows a circuit diagram of the other source follower capable of compensating the threshold voltage of the preferred embodiment according to the present invention.
FIG. 3B schematically shows a timing diagram of the other source follower capable of compensating the threshold voltage of the preferred embodiment according to the present invention.

Then, a source follower of the p-type transistor is described. Referring to both FIG. 3A and FIG. 3B, it schematically shows a circuit diagram and a timing diagram of the other source follower capable of compensating the threshold voltage of the preferred embodiment according to the present invention, respectively. As shown in FIG. 3A, the source follower 300 comprises a p-type transistor 310, a current source 320, and a switching circuit 330. The p-type transistor 310 comprises a drain 312, a gate 316 and a source 314, wherein the drain 312 is grounded, and the source 314 outputs an output voltage. The current source 320 comprises a 1st electrode 322 and a 2nd electrode 324, wherein the 1st electrode 322 is coupled to a positive voltage, and the 2nd electrode 324 is coupled to the source 314. The switching circuit 330 is coupled to the p-type transistor 310, the current source 320, and the input voltage.

At first, only the switching circuit 330 comprising a 1st switch 332, a 2nd switch 342, a 3rd switch 352, and a storage capacitor 362 is exemplified herein for description. In the switching circuit 330, the 1st switch 332 comprises a 3rd electrode 334 and a 4th electrode 336. Wherein, the 3rd electrode 334 is coupled to the input voltage, and the 4th electrode 336 is coupled to the gate 316 of the p-type transistor 310. The 2nd switch 342 comprises a 5th electrode 344 and a 6th electrode 346. Wherein, the 5th electrode 344 is coupled to the input voltage and the 3rd electrode 334. The 3rd switch 352 comprises a 7th electrode 354 and an 8th electrode 356. Wherein, the 7th electrode 354 is coupled to the 6th electrode 346, and the 8th electrode 356 is coupled to the source 314 of the p-type transistor 310 and the 2nd electrode 324. The storage capacitor 362 comprises a 9th electrode 364 and a tenth electrode 366. Wherein, the 9th electrode 364 is coupled to the 4th electrode 336 and the gate 316 of the p-type transistor 310, and the tenth electrode 366 is coupled to the 6th electrode 346 and the 7th electrode 354. Then, the operating process of the source follower 300 that only includes a capacitor is described hereinafter. At first, the 1st switch 332 and the 3rd switch 352 are shorted, and the 2nd switch 342 is opened. Meanwhile, the storage capacitor 362 stores a potential that is equal to the threshold voltage of the p-type transistor 310. Then, the 1st switch 332 and the 3rd switch 352 are opened, and the 2nd switch 342 is shorted. Meanwhile, the voltage at the gate 316 of the p-type transistor 310 is equal to the voltage of the threshold voltage of subtracting the p-type transistor 310 from the input voltage. Therefore, the output voltage is nearly equal to the input voltage.

Then, the switching circuit 330 comprising a 4th switch 372, a 5th switch 382, and a compensating capacitor 392 is exemplified hereinafter for description. For those who are skilled in the art, it is to be noted that although the switching circuit 330 comprising only two capacitors and a plurality of switches is exemplified hereinafter for description, the switching circuit comprising more than two capacitors and a plurality of switches also can be applied in the present invention. In the switching circuit 330, the 4th switch 372 comprises an 11th electrode 374 and a 12th electrode 376. Wherein, the 11th electrode 374 is coupled to the 3rd electrode 334, the 5th electrode 344, and the input voltage. The 5th switch 382 comprises a 13th electrode 384 and a 14th electrode 386. Wherein, the 13th electrode 384 is coupled to the 12th electrode 376, and the 14th electrode 386 is coupled to the 2nd electrode 324, the 8th electrode 356, and the source 314 of the p-type transistor 310. The compensating capacitor 392 comprises a 15th electrode 394 and a 16th electrode 396. Wherein, the 15th electrode 394 is coupled to the 6th electrode 346, the 7th electrode 354, and the 10th electrode 366, and the 16th electrode 396 is coupled to the 12th electrode 376 and the 13th electrode 384. The operating process of the source follower 300 comprising two capacitors is described hereinafter. At first, the 1st switch 332, the 3rd switch 352, and the 5th switch 382 are shorted, and the 2nd switch 342 and the 4th switch 372 are opened. Meanwhile, the storage capacitor 362 stores a potential that is equal to the threshold voltage of the p-type transistor 310, and the compensating capacitor 392 is reset. Then, the 1st switch 332, the 3rd switch 352, and the 4th switch 372 are opened, and the 2nd switch 342 and the 5th switch 382 are shorted. Meanwhile, the voltage at the gate 316 of the p-type transistor 310 is a voltage of subtracting the threshold voltage from the input voltage, and the input voltage differs from the output voltage an error voltage. Wherein, the error voltage is stored in the compensating capacitor 392. Finally, the 1st switch 332, the 2nd switch 342, the 3rd switch 352, and the 5th switch 382 are opened, and the 4th switch 372 is shorted. Meanwhile, the voltage at the gate 316 of the p-type transistor 310 is a voltage subtracting the threshold voltage and the error voltage from the input voltage, so that the difference between the input voltage and the output voltage is small enough to fall in the range of the gray level error tolerance. From above descriptions, the more the capacitors and switches comprised in the switching circuit 330, the smaller the error between the input voltage and the output voltage.

In summary, the source follower capable of compensating the threshold voltage according to the present invention has following advantages: (1) The source follower capable of compensating the threshold voltage according to the present invention makes the threshold voltage of the transistor constant by using the current source. (2) The source follower capable of compensating the threshold voltage according to the present invention makes the input voltage nearly equal to the output voltage by using the storage capacitor and the compensating capacitor, so that the error of the output voltage falls in the error range of the gray level voltage.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A source follower capable of compensating a threshold voltage, suitable for using in a display comprising:
    an n-type transistor, having a drain, a gate, and a source, wherein the drain is coupled to a positive voltage, and the source outputs an output voltage;
    a current source, having a 1st electrode and a 2nd electrode, wherein the 1st electrode is coupled to the source, and the 2nd electrode is grounded; and
    a switching circuit, coupled to the n-type transistor, the current source, and an input voltage comprising:
    a 1st switch, having a 3rd electrode and a 4th electrode, wherein the 3rd electrode is coupled to the input voltage, and the 4th electrode is coupled to the gate;
    a 2nd switch, having a 5th electrode and a 6th electrode, wherein the 5th electrode is coupled to the input voltage and the 3rd electrode;
    a 3rd switch, having a 7th electrode and an 5th electrode, wherein the 7th electrode is coupled to the 6th electrode, and the 8th electrode is coupled to the source and the 1st electrode; and
    a storage capacitor, having a 9th electrode and a 10th electrode, wherein the 9th electrode is coupled to the 4th electrode and the gate, and the 10th electrode is coupled to the 6th electrode and the 7th electrode, wherein the switching circuit further comprises:
    a 4th switch, having an 11th electrode and a 12th electrode, wherein the 11th electrode is coupled to the 3rd electrode, the 5th electrode, and the input voltage;
    a 5th switch, having a 13th electrode and a 14th electrode, wherein the 13th electrode is coupled to the 12th electrode, and the 14th electrode is coupled to the 1st electrode, the 8th electrode, and the source; and
    a compensating capacitor, having a 15th electrode and a 16th electrode, wherein the 15th electrode is coupled to the 12th electrode and the 13th electrode, and the 16th electrode is coupled to the 6th electrode, the 7th electrode, and the 10th electrode.

2. The source follower capable of compensating the threshold voltage of claim 1, wherein when the 1st switch, the 3rd switch, and the 5th switch are short, and the 2nd switch and the 4th switch are open, a potential stored in the storage capacitor is equal to the threshold voltage of the n-type transistor, and the compensating capacitor is reset.

3. The source follower capable of compensating the threshold voltage of claim 2, wherein when the 1st switch, the 3rd switch, and 4th switch are open, and the 2nd switch and the 5th switch are short, a voltage on the gate of the source follower is a summation of the input voltage and the threshold voltage, and the input voltage differs from the output voltage an error voltage, and the error voltage is stored in the compensating capacitor.

4. The source follower capable of compensating the threshold voltage of claim 3, wherein when the 1st switch, the 2nd switch, the 3rd switch, and the 5th switch are open, and the 4th switch is short, a voltage on the gate of the source follower is a summation of the input voltage plus the threshold voltage and plus the error voltage.

5. A source follower capable of compensating a threshold voltage, suitable for using in a display, comprising:
    a p-type transistor, having a drain, a gate, and a source, wherein the drain is grounded, and the source outputs an output voltage;
    a current source, having a 1st electrode and a 2nd electrode, wherein the 1st electrode is coupled to a positive voltage, and the 2nd electrode is coupled to the source; and
    a switching circuit, coupled to the p-type transistor, the current source, and an input voltage, comprising:
    a 1st switch, having a 3rd electrode and a 4th electrode, wherein the 3rd electrode is coupled to the input voltage, and the 4th electrode is coupled to the gate;
    a 2nd switch, having a 5th electrode and a 6th electrode, wherein the 5th electrode is coupled to the input voltage and the 3rd electrode;
    a 3rd switch, having a 7th electrode and an 8th electrode, wherein the 7th electrode is coupled to the 6th electrode, and the 8th electrode is coupled to the source and the 2nd electrode; and
    a storage capacitor, having a 9th electrode and a 10th electrode, wherein the 9th electrode is coupled to the 4th electrode and the gate, and the 10th electrode is coupled to the 6th electrode and the 7th electrode, wherein the switching circuit further comprises:
    a 4th switch, having an 11th electrode and a 12th electrode, wherein the 11th electrode is coupled to the 3rd electrode, the 5th electrode, and the input voltage;
    a 5th switch, having a 13th electrode and a 14th electrode, wherein the 13th electrode is coupled to the 12th electrode, and the 14th electrode is coupled to the 2nd electrode, the 8th electrode, and the source; and a compensating capacitor, having a 15th electrode and a 16th electrode, wherein the 15th electrode is coupled to the 6th electrode, the 7th electrode, and the 10th electrode, and the 16th electrode is coupled to the 12th electrode and the 13th electrode.

6. The source follower capable of compensating the threshold voltage of claim 5, wherein when the 1st switch, the 3rd switch, and the 5th switch are short, and the 2nd switch and the 4th switch are open, a potential stored is the storage capacitor is equal to the threshold voltage of the p-type transistor, and the compensating capacitor is reset.

7. The source follower capable of compensating the threshold voltage claim 6, wherein when the 1st switch, the 3rd switch, and 4th switch are open, and the 2nd switch and the 5th switch are short a voltage on the gate of the source follower is a voltage subtracting the threshold voltage from the input voltage, and the input voltage differs from the output voltage an error voltage, and the error voltage is stored in the compensating capacitor.

8. The source follower capable of compensating the threshold voltage of claim 7, wherein when the 1st switch, the 2nd switch, the 3rd switch, and the 5th switch are open, and the 4th switch is short, a voltage on the gate of the source follower is a voltage subtracting the threshold voltage and the error voltage from the input voltage.

* * * * *